(12) United States Patent
Buggenthin et al.

(10) Patent No.: US 11,501,030 B2
(45) Date of Patent: Nov. 15, 2022

(54) COMPUTER-IMPLEMENTED METHOD AND APPARATUS FOR AUTOMATICALLY GENERATING IDENTIFIED IMAGE DATA AND ANALYSIS APPARATUS FOR CHECKING A COMPONENT

(71) Applicant: SIEMENS AKTIENGESELLSCHAFT, Munich (DE)

(72) Inventors: Felix Buggenthin, Munich (DE); Ulli Waltinger, Neuburg (DE)

(73) Assignee: Siemens Aktiengesellschaft, Munich (DE)

(*) Notice: Subject to any disclaimer, the term of this patent is extended or adjusted under 35 U.S.C. 154(b) by 386 days.

(21) Appl. No.: 16/633,652

(22) PCT Filed: Jul. 27, 2018

(86) PCT No.: PCT/EP2018/070416
§ 371 (c)(1),
(2) Date: Jan. 24, 2020

(87) PCT Pub. No.: WO2019/020791
PCT Pub. Date: Jan. 31, 2019

(65) Prior Publication Data
US 2020/0167510 A1 May 28, 2020

(30) Foreign Application Priority Data

Jul. 28, 2017 (DE) .................. 10 2017 213 060.1

(51) Int. Cl.
*G06K 9/00* (2022.01)
*G06F 30/12* (2020.01)
(Continued)

(52) U.S. Cl.
CPC .............. *G06F 30/12* (2020.01); *G06F 16/51* (2019.01); *G06N 3/04* (2013.01); *G06T 7/001* (2013.01);
(Continued)

(58) Field of Classification Search
CPC ........... G06F 30/12; G06F 16/51; G06N 3/04; G06N 20/00; G06T 7/001;
(Continued)

(56) References Cited

U.S. PATENT DOCUMENTS 5,969,973 A * 10/1999 Bourne .............. G05B 19/4097
700/165
2013/0279790 A1 10/2013 Kaizerman
(Continued)

OTHER PUBLICATIONS

German Office Action for German Application No. 10 2017 213 060.1 dated Dec. 5, 2017.
(Continued)

*Primary Examiner* — Samir A Ahmed
(74) *Attorney, Agent, or Firm* — Lempia Summerfield Katz LLC

(57) ABSTRACT

The present disclosure relates to the automatic generation of characterized image data. For this purpose, a visual representation of a component is computed on the basis of existent structure data for the component, wherein the surface properties of the visual representation of the component may be varied based on predefined characteristic properties. Because, in the computation of such visual representations, both the component itself and the underlying characteristic surface properties are known, this information may be used for characterizing the corresponding parts in the visual representation in order to achieve automatic characterization of the computed visual representation.

20 Claims, 2 Drawing Sheets

10  Apparatus
11  First database
12  Second database
13  Third database
20  Image data generator
30  Reference image data memory
40  Evaluation device
50  Camera

(51) Int. Cl.
*G06F 16/51* (2019.01)
*G06N 3/04* (2006.01)
*G06T 7/00* (2017.01)
*G06N 20/00* (2019.01)

(52) U.S. Cl.
CPC .... *G06N 20/00* (2019.01); *G06T 2207/20084* (2013.01); *G06T 2207/30164* (2013.01)

(58) Field of Classification Search
CPC .......... G06T 2207/20084; G06T 2207/30164; G01M 5/0091; G01M 15/14; G01M 5/0033; G01M 13/00; G07C 3/00; G05B 2219/32186; Y02P 90/02
See application file for complete search history.

(56) References Cited

U.S. PATENT DOCUMENTS

| | | |
|---|---|---|
| 2014/0079314 A1 | 3/2014 | Yakubovich |
| 2016/0253447 A1* | 9/2016 | Fan ........................ G06F 30/39 716/55 |
| 2017/0072639 A1* | 3/2017 | Levine .................. B29C 64/386 |
| 2017/0153627 A1* | 6/2017 | Jäger .................. G06Q 10/0631 |
| 2018/0173824 A1* | 6/2018 | Ceschini ............... G06F 11/008 |

OTHER PUBLICATIONS

Mérillou, Stéphane, Jean-Michel Dischler, and Djamchid Ghazanfarpour. "Surface scratches: measuring, modeling and rendering." The Visual Computer 17.1 (2001): 30-45.

PCT International Search Report and Written Opinion of International Searching Authority dated Dec. 17, 2018 corresponding to PCT International Application No. PCT/EP2018/070416 filed Jul. 27, 2018.

* cited by examiner

| 10 | Apparatus |
| 11 | First database |
| 12 | Second database |
| 13 | Third database |
| 20 | Image data generator |
| 30 | Reference image data memory |
| 40 | Evaluation device |
| 50 | Camera |

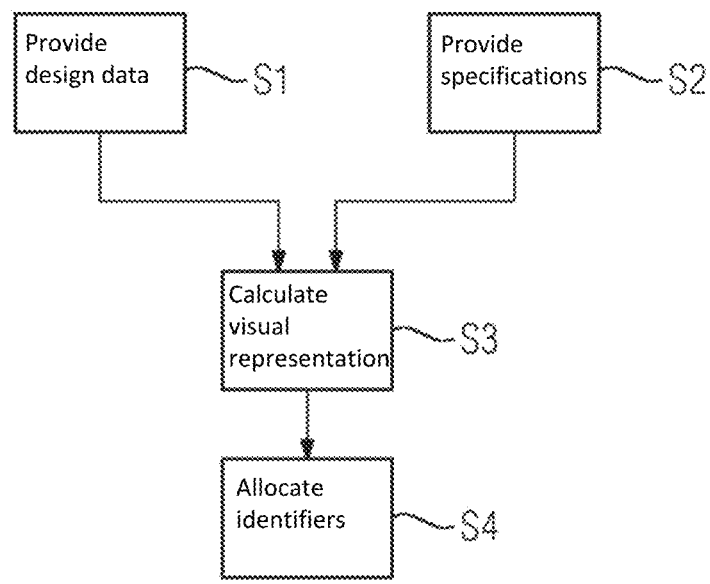

COMPUTER-IMPLEMENTED METHOD AND APPARATUS FOR AUTOMATICALLY GENERATING IDENTIFIED IMAGE DATA AND ANALYSIS APPARATUS FOR CHECKING A COMPONENT

The present patent document is a § 371 nationalization of PCT Application Serial No. PCT/EP2018/070416, filed Jul. 27, 2018, designating the United States, which is hereby incorporated by reference, and this patent document also claims the benefit of German Patent Application No. 10 2017 213 060.1, filed Jul. 28, 2017, which is also hereby incorporated by reference.

TECHNICAL FIELD

The present disclosure relates to a computer-implemented method and an apparatus for automatically generating identified image data of components. The disclosure also relates to an analysis apparatus for checking a component.

BACKGROUND

Increasing digitization, particularly in the industrial sphere, is currently leading to far-reaching changes. In this regard, there already exist open operating system solutions enabling machines and physical infrastructures to be connected to the digital world. One example thereof is Siemens MindSphere, which, as a cloud-based operating system for the so-called internet of things, provides a platform for analyzing industrial data in order to realize numerous groundbreaking applications for example of artificial intelligence. In this regard, by way of example, by an optical analysis, it is possible efficiently to identify defective components and thereupon to initiate all necessary acts for a repair process.

Data processing here requires a comprehensive database precisely in applications for artificial intelligence. For this purpose, large amounts of manually acquired image data have been required hitherto for training purposes. In order to be able to train an artificial intelligence system with these image data, however, these real image data have to be correspondingly identified. During this identification process, it is necessary to identify relevant regions in each case in the image data and afterward one or more properties must be allocated to each region. By way of example, a plurality of photographs may be taken of a component, such as a mechanical shaft or a turbine blade, for example. In particular, a component may be photographed from a plurality of different perspectives, for example. Moreover, one component or else optionally a plurality of identical or similar components may also be captured photographically in different operating states, stages of aging or with different types of damage. Afterward, each individual one of these photographs has to be evaluated manually in order to identify the component in the corresponding image and optionally also to allocate characteristic properties such as aging state, possible damage, etc., to the component.

In the context of the complexity of modern industrial installations and the enormous amount of data thus obtained, even now it is no longer possible to carry out manually the capture of the images and the identification of the obtained image data that is required over and above that. Even partly automatic approaches which support a user in the identification of the image data are encountering their limits very rapidly on account of the enormous amount of image data and the complexity of the systems represented in these image data. Moreover, the above-described capture of image data and the downstream identification only make it possible to acquire image data of already existing real systems and the instances of damage or wear phenomena that have occurred in that case. Furthermore, it is also necessary, in order to acquire image data of the real components, to expose the corresponding components in each case to an extent such that the components may be photographed. Consequently, if the wear of a component over the operating time is intended to be documented photographically, then at regular intervals the corresponding component has to be demounted, photographed, and then reinstalled. This, too, requires an unmanageable effort precisely in complex technical systems.

Therefore, there is a need for the automatic generation of identified image data. In particular, there is a need for the generation of identified image data which may be used as a basis for data processing in complex technical installations. Moreover, there is a need for the analysis of components on the basis of image data identified in this way.

SUMMARY AND DESCRIPTION

The present disclosure relates to a computer-implemented method for generating identified image data, an apparatus for automatically generating identified image data, and an analysis apparatus for checking a component.

The scope of the present disclosure is defined solely by the appended claims and is not affected to any degree by the statements within this summary. The present embodiments may obviate one or more of the drawbacks or limitations in the related art.

A computer-implemented method is disclosed herein for generating identified image data of components. The method includes the acts of providing design data for a component and providing specifications for possible surface properties of the component. Furthermore, the method includes an act for calculating a visual representation of the component. In this case, the visual representation is calculated using the provided design data and the provided specifications for the surface properties of the component. Additionally, the method includes an act for automatically allocating predetermined identifiers to the calculated visual representation of the component.

An apparatus is disclosed herein for automatically generating identified image data of components. The apparatus includes a first database, a second database, and an image data generator. The first database is designed to provide design data for a component. The second database is designed to provide specifications for possible surface properties of the component. The image data generator is designed to calculate a visual representation of the component. The visual representation is calculated, in particular, using the design data provided by the first database and the specifications for possible surface properties provided by the second database. Furthermore, the image data generator is designed to assign automatically predetermined identifiers to the calculated visual representation of the component.

An analysis apparatus is disclosed herein for checking a component including an apparatus for generating identified image data, a reference image data memory and an evaluation device. The reference image data memory is designed to store the identified image data generated by the apparatus for automatically generating identified image data. The evaluation device is designed to receive a camera image of a component to be checked and to compare the received camera image with the identified visual representations stored in the reference image data memory.

Several advantages of the disclosure are provided herein.

The present disclosure is based on the insight that a database having a multiplicity of identified image data is accorded great importance for the diagnostics of complex industrial installations. Furthermore, the present disclosure is based on the insight that creating such a database for complex industrial installations, and in particular identifying individual elements in image data, poses a great challenge that cannot be realized in a conventional way and in particular even using human work capacity.

The present disclosure is therefore based on the concept of providing a solution which makes it possible fully automatically to generate identified image data for components of industrial installations and to condition the image data for further use in a digital environment. For this purpose, the present disclosure firstly provides for digitally calculating the image data of components in industrial installations, rather than obtaining the image data in a conventional way by photographing real components. Because components of modern installations may already be designed in a digital environment anyway, digital design data are also present for such components. On the basis of these digital design data, a three-dimensional model of the component may thus be calculated in a simple manner. In particular, it is possible here to calculate a model of the component on the basis of the design data present. For this purpose, by way of example, conventional computer aided design (CAD) data or any other design data may be used as design data.

In this case, the design data may already also provide information about the used materials of the component for which a visual representation is intended to be calculated. Moreover, during the calculation of the visual representation of the component, any modification, impediment, aging, damage, etc. may also already be simulated and concomitantly included in the calculation of the visual representation. In this regard, by way of example, as a result of the specification of various surface properties for the component, it is also possible to simulate various different states of the component. By way of example, for various stages of aging, it is possible to define in each case various properties of a surface which characterize the visual representation of the respective component in a predefined state.

In this way, for example, corrosion (such as rusting or the like), increasing roughening or else abrasion of a region of the component, the formation of cracks (such as microcracks or the like), expansion of a region of the component, contraction of a region of the component, or warpage of a region of the component, a change on account of the effect of heat, or any other change in the surface properties of the component may be simulated and concomitantly included in the visual representation to be generated. This enables a particularly efficient, multilayered and also faithfully detailed generation of visual representations of the component.

Because the underlying boundary conditions, in particular the respective specifications of the surface properties, are known in each case for each individual calculated visual representation of the component, these known properties may also be assigned directly to the visual representation respectively calculated. In this case, it is also known, in particular, which image region in the visual representation corresponds to which part of the component and which surface properties were taken as a basis for the respective calculation. As a result, a corresponding identifier with the underlying parameters may be assigned very precisely to each individual part of a component in the visual representation.

As a result, in this way, very rapidly, cost-effectively and efficiently, it is possible to generate image data of components and in the process, in the image data, also to allocate to individual partial regions identifiers which correspond to the underlying specifications for the generation of the image data.

In this way, it is also possible safely to obtain image data of components which correspond to a component under particularly high and possibly critical stress. In particular, it is also possible to calculate image data which correspond to a component after stress in a dangerous operating state, without the component being operated in such a dangerous operating state. Furthermore, in this way, it is also possible to obtain image data from perspectives which, under real conditions, are not possible or are possible only with great effort.

In total, a rapid, cost-effective, flexible and reliable generation of image data of components with simultaneous identification of the image data is possible in this way.

In the explanations above and below, a distinction is drawn in particular between the first database for storing the design data and the second database for storing the identified image data. Even though different databases or different storage apparatuses/storage media may be used for this, in principle, nevertheless it is moreover also possible to store and provide all data in a common database, in particular a common storage apparatus/common storage medium.

The storage unit referred to here as the second database may be a knowledge base, for example, which may be utilized for further applications, such as an automatic diagnosis of a component, for example.

In accordance with one embodiment, the provided specifications for the surface properties include characteristic textures, in particular for predetermined regions of a surface of the component. Such characteristic textures may correspond for example to different stages of corrosion such as, for example, rusting or some other oxidization. Furthermore, different textures may also include different gradations of scratching of a specific region of the component, different stages of abrasion or grinding-in on a component, different stages of the formation of cracks, in particular for example of microcracks or the like, different stages of a thermal effect of heat or cold on the component, a deformation of a partial region on the component, in particular warpage, expansion, contraction or the like, corrugation on a region of the surface and any other physical or chemical effect on a region of the component. In this way, numerous different impediments, such as wear, aging, overloading or the like, on the component may be simulated simply, cost-effectively and also safely in order to obtain a suitable optical representation of the component therefrom. In this case, the respective underlying specifications and the textures associated therewith may be allocated directly automatically to the corresponding region in the generated visual representation in order to obtain a corresponding identifier in the image data obtained.

In accordance with one embodiment, the characteristic textures may specify in particular properties such as wear, aging, a predefined loading, contamination, or else a potential probability of failure of the component. This information may be considered when automatically allocating the predefined identifier in order to serve as a reference for the diagnosis of image data of real components.

In accordance with one embodiment, calculating the visual representation of the component is effected from a predefined perspective and/or along a predefined observation path. In particular, by way of example, a flight of a virtual drone along a flight path for the observation of a component may be predefined as a movement path. This enables a particularly flexible, universal generation of image data from almost any viewing angles and perspectives.

In accordance with one embodiment, the design data taken as a basis for the calculated visual representation include CAD data or manufacturing data for producing the component. On account of modern manufacturing technology, such design data are already present for almost all components. Therefore, the visual representations of the component may be calculated particularly simply without further, possibly complex intermediate acts. In this case, the calculation of the visual representations of the component may be produced for example on the basis of algorithms and/or graphics units such as are already used for example for the calculation of images in computer games or other optical simulations. In particular, firstly a three-dimensional model may be calculated from the design data, on the basis of which model the visual representation of the component is generated. In this case, the visual representation may correspond to a two-dimensional image.

In accordance with one embodiment, automatically allocating the predetermined identifiers to the calculated visual representations of the component includes a multilevel hierarchical characterization, in particular of at least one part of the component. As a result of a multilevel hierarchical characterization, the individual properties of the component in the calculated visual representations may be specified particularly efficiently and precisely.

In accordance with one embodiment, automatically allocating the predetermined identifiers to the calculated visual representations of the component includes at least one diagnosis for a predefined fault, an indication concerning possible damage, a prognosis for a probability of failure and/or a repair recommendation. Moreover, the predetermined identifiers may also include any further parameters, properties or values which are suitable for characterizing properties of a part of the component in the visual representation.

In accordance with one embodiment, the computer-implemented method for generating the image data includes an act for storing the visual representation of the component together with the allocated identifiers in a database, and an act for comparing a camera image of a component to be diagnosed with the stored visual representation. In this way, by comparing a camera image of a real component with the generated image data, it is possible in a simple manner to characterize the component and, in particular from the allocated identifiers, also to make a statement about the current state of the component. In this case, the comparison of the calculated and identified image data with real image data may include not just a direct pairwise comparison of image data. Rather, it is also possible to carry out a more complex analysis of the image data on the basis of the calculated identified image data. Methods based on artificial intelligence and neural networks or the like may be used for this purpose.

In accordance with one embodiment, the evaluation device of the analysis apparatus for checking a component is designed to identify a correspondence between at least one part of the camera image and a part of a calculated visual representation of a component. In this case, the evaluation device may be designed to output identifiers which corresponds in the visual representation of the identified part of the component in the identified image data. Such identifiers may be utilized for the diagnosis of a component to be checked in order to establish a rapid, reliable and efficient diagnosis of the component. Rapid, near-instantaneous, and cost-effective maintenance or repair of the component may be implemented on the basis of such a diagnosis.

In accordance with one embodiment, the analysis apparatus includes a control device. The control device may be designed to generate one or more control commands depending on the result of the comparison between the camera image and the identified image data. The generated control commands may thereupon be output. The control commands may be a shutdown command in order to shut down an installation having the corresponding component in the event of a dangerous situation. Moreover, the control command may also include a command for transitioning an installation to a predetermined operating state enabling safe further operation, at least for a predefined period of time, on the basis of the analysis of the component. Moreover, the control command may also include a repair recommendation for the maintenance of the component to be diagnosed. Furthermore, the control command may also be utilized to instigate automatic ordering of required spare parts for the maintenance or repair of the component. It goes without saying that any further control commands on the basis of the preceding analysis are also possible.

In accordance with one embodiment, the analysis device includes an interface. This interface may be designed to receive at least one camera image of the component to be checked. This interface may be a wired interface coupled to one or more camera directly or via a databus or the like. Moreover, the interface may also be a radio interface that receives image data from one or more cameras via a wireless transmission. By way of example, it is also possible to receive image data from a cellular phone, a tablet computer, or any other mobile or portable system having an image capture device.

In accordance with one embodiment of the analysis apparatus, the evaluation device of the analysis apparatus is designed to carry out the comparison between the camera image and the stored identified visual representations on the basis of artificial intelligence. In particular, a so-called convolutional neural network (CNN) may be implemented in the analysis apparatus. A CNN is a feedforward artificial neural network. This involves a concept in the field of machine learning that is inspired by biological processes.

The above configurations and developments, in so far as is practical, may be combined with one another in any desired way. Further configurations, developments, and implementations of the present disclosure also encompass not explicitly mentioned combinations of features described above or below with regard to the exemplary embodiments. In particular, the person skilled in the art will also add individual aspects as improvements or supplementations to the respective basic forms of the present disclosure.

BRIEF DESCRIPTION OF THE DRAWINGS

The present disclosure is explained in greater detail below on the basis of the exemplary embodiments indicated in the schematic figures of the drawings, in which:

FIG. 3 depicts a flow diagram such as forms the basis of a computer-implemented method for generating identified image data in accordance with one embodiment.

DETAILED DESCRIPTION

Figure 1:
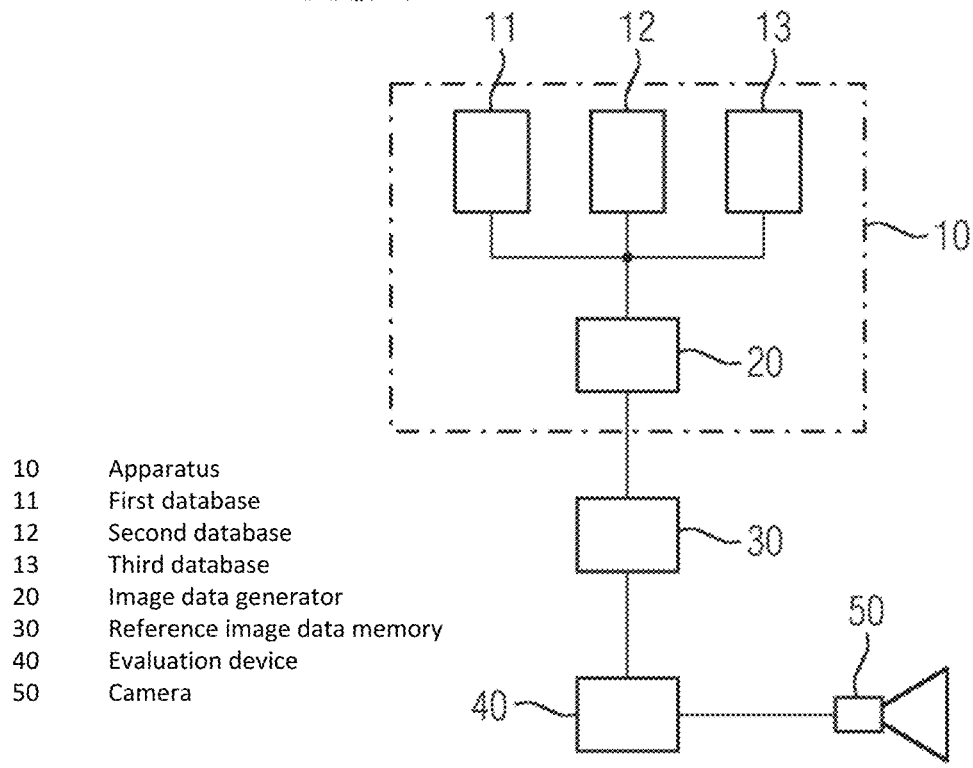
FIG. 1 depicts a schematic illustration of an analysis apparatus for checking a component including an apparatus for automatically generating image data in accordance with one embodiment.

FIG. 1 shows a schematic illustration of an analysis apparatus for checking a component in accordance with one embodiment. The analysis apparatus may include for example an apparatus 10 for automatically generating identified image data. This apparatus 10 for automatically generating identified image data includes a first database 11, in which design data for one or more components are provided. The design data may be CAD data or any other design data for a component. Because it has been the case in recent times that digital systems are increasingly being used for the design of components, the design data of the components may also already be present in digital form. The design data of the component may be utilized as an initial basis for generating identified image data. For this purpose, the corresponding design data may be stored and provided in the first database 11. Furthermore, specifications for possible surface properties of components may be provided in a second database 12. These specifications of surface properties may characterize various material properties of a component. By way of example, textures for different material states or surface states of a component may be specified in the second database 12. In this regard, by way of example, textures for different gradations of corrosion on a material surface may be specified. For example, gradations of varying severity for the rusting of an iron surface and the textures of the respective surface which correspond thereto may be specified. Furthermore, wear as a result of abrasion of a material surface and the textures corresponding thereto may also be specified in the second database 12. Further characteristic properties such as the formation of grooves or furrows on account of two material surfaces rubbing on one another may also be specified. Furthermore, a thermal effect as a result of cold or heat on a material may possibly also lead to a characteristic optical change, which may likewise be specified in the second database 12. By way of example, so-called temper colors occur as a result of a strong thermal effect on a metal, and the maximum temperature effect may be gauged from the colors. Corresponding colors or textures may be specified for the corresponding surfaces of a component in the second database 12. Further characteristic properties that are specified in the second database 12 are for example contaminations, in particular including contaminations possibly resulting from improper use of the component, the formation of cracks, in particular microcracks, during normal operation or overloading of the component, characteristic deformations, expansions or contractions of a part of the component and associated changes in the surface of a part of the component, but also changes in a material thickness and associated changes in the optical appearance of the component and also any other characteristic optically perceptible changes to the surface of the component.

Furthermore, positions from the perspective of which a visual representation of a component is intended to be calculated may be specified in a third database 13, for example. In this case, by way of example, it is possible to specify individual positions from the perspective of which a visual representation is intended to be calculated, or more complex movement paths are also possible, such as, for example, lines, curves, polygon progressions or the like, along which a virtual camera moves. In this way, by way of example, it is possible to simulate virtual flights of a drone, or the like, which moves along a component or around a component. In particular, in this way, it is possible to predefine even perspectives which are not possible or are possible only with great effort under real conditions on a component in the installed state.

Even though the first database 11, the second database 12, and the third database 13 have been described here as individual, separate databases, nevertheless it is also possible to store and provide the data from two or all three databases in a common storage device.

In the text above and below, consideration is given in each case to a component. Here, the expression "a component" should not be understood as a single individual component. Rather, the term component may also be understood to refer to complex machine arrangements composed of an arbitrary number of individual parts. In this regard, the visual representation of the component that is to be generated may also encompass the representation of a complete machine or of a subassembly of a machine. In the case of a power plant, for example, component may also be understood to mean a complete turbine, a drive shaft including bearings, or any other assemblage composed of a plurality of machine parts or structural elements.

On the basis of the information provided in the databases 11 to 13, an image data generator 20 may calculate a visual representation of the component. For this purpose, for example, a three-dimensional model of the component may be calculated from the design data. In a further act, it is possible to determine the surface of the three-dimensional model in accordance with the specifications for the surface properties. In this way, it is possible, for example, for specific stresses, damage, wear, or the like to be concomitantly included in the calculation of the visual representation of the component. On the basis of the underlying data, in this way, it is possible to simulate the component in almost any arbitrary state and to generate a visual representation based thereon. In particular, visual representations of the component are also possible which are attributable to overloadings possibly in dangerous operating states. Such image data may thus be obtained safely, without the component actually having to be brought to such a dangerous or at least critical operating state.

Because the information on which the calculation of the image data is based is fully known, a corresponding parameterization may also be assigned in each case to the individual regions in the image data. By way of example, if an optical representation attributable to a high heat effect is calculated at a predefined region of the component, then the corresponding region may be correspondingly characterized, (e.g., parameterized), in the calculated visual representation. For example, this partial region of the component may be assigned the designation of the component, the designation of the corresponding partial region in the component, the material used in this partial region of the component, and the still underlying heat effect in this partial region may be assigned to the corresponding partial region of the image. As may already be gathered from this preceding example, the assignment of identifiers in partial regions to the calculated visual representation may be based on a multilevel hierarchical structure. Moreover, any other types of assignment of identifiers to partial regions in the image data are also possible, in principle. Moreover, in principle, a common property or identifier may be allocated to a plurality of partial regions of the component in the visual representation.

Once image data with a visual representation of a component have been calculated using the data from the databases 11 to 13 and they have been provided with suitable identifiers, the generated image data with the identifiers may be stored in a reference image data memory 30. In this case, the image data, in particular the assignment of the identifier to partial regions in the image data, may be stored in any desired structure. In particular, here any desired databases with a 1:n structure or else an m:n structure may be utilized for the assignment of identifiers to the image data.

The identified image data stored in the reference image data memory 30 may be used for example to train an analysis system 40. The analysis system 40 may be an arbitrary system which may carry out an evaluation, in particular, an evaluation of image data of real components, on the basis of identified image data provided. Such a system may be a system based on artificial intelligence. For example, neural networks may also be trained on the basis of the calculated image data provided, in order to enable an analysis of image data of real components.

For checking a component, a real image of a component may be provided to the evaluation device 40. This real image of the component may be recorded by a camera 50, for example. The camera 50 may be coupled to the evaluation device 40 by a wired connection. Moreover, wireless communication paths between the camera 50 and the evaluation device 40 are also possible. For example, one or else optionally a plurality of cameras 50 may be installed in a machine hall, the camera(s) optically capturing a component or an installation having one or a plurality of components. The image data acquired in this case may be provided to the evaluation device 40, which thereupon carries out a comparison or an evaluation on the basis of the identified image data stored in the reference image data memory 30. In this way, monitoring and early fault detection may be performed continuously during the operation of an installation. Moreover, also at predefined intervals, for example during maintenance or the like, in particular during stoppage of an installation, image data of a component may be acquired and they may be provided to the evaluation device 40. In this case, too, the evaluation device 40 may make a diagnosis on the basis of the identified image data in the reference image data memory 30 in order to make as precise a statement as possible about the current state of the component which has been optically captured by the camera 50.

The analysis may be a comparison of the acquired image data of the real component with the image data stored in the reference image data memory 30. Moreover, any further, possibly more complex analyzes on the basis of the image data stored in the reference image data memory 30 are also possible.

The current state of the component to be checked may thereupon be determined on the basis of the analysis in the evaluation device 40. Furthermore, optionally, a prognosis about the further development of the component and an estimation of the remaining residual lifetime still to be expected for the component are also possible.

If the component has damage, such as, for example, cracks or the like, which may be detected on the basis of the image data stored in the reference image data memory 30, then such damage may be diagnosed. If appropriate, an ordering process for a required spare part may thereupon be initiated automatically. Furthermore, further repair measures may also be instigated in order to achieve rapid restitution of the component to be diagnosed. The availability of the component and of the entire technical installation associated therewith may be increased in this way.

Figure 2:
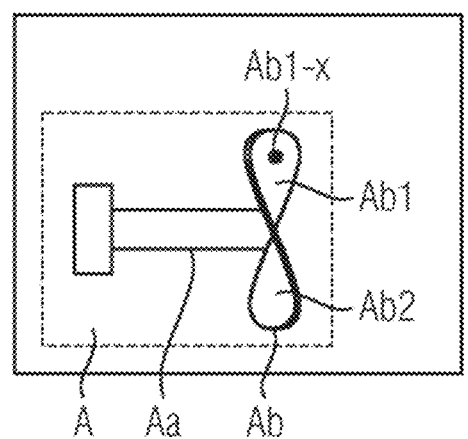
FIG. 2 depicts a schematic illustration of identified image data such as form the basis of one embodiment.

FIG. 2 shows a schematic illustration of automatically generated image data with corresponding identifiers such as are taken as a basis of one embodiment. The image illustrated in FIG. 2 is a greatly simplified schematic illustration. The illustration of the component includes a component A having two partial elements Aa and Ab. In this case, the specification of the component may be effected for example on the basis of the design data. A three-dimensional model may be calculated on the basis of the design data. The partial element Ab may furthermore be subdivided into two segments Ab1 and Ab2, for example. Furthermore, a particular stress may be assumed on the partial element Ab1, for example. This particular stress may lead for example to a change in the surface and a correspondingly modified texture of the visual representation. This is illustrated by identifier Ab1-$x$ in FIG. 2. Because the respective boundary conditions are known during the generation of the visual representation of the component A by virtue of the design data and the characteristic properties for the surface properties of the component, a corresponding identifier may be assigned in each case in corresponding partial regions of the visual representation. Afterward, image data identified in this way may for example be stored in the above-described reference image data memory 30 and be utilized as training or reference data for a later analysis of similar components.

FIG. 3 shows a schematic illustration of a flow diagram such as is taken as a basis of a computer-implemented method for generating identified image data of components. Design data for a component are provided in act 51. Furthermore, specifications for possible surface properties of a component are provided in act S2. In a further act, moreover, it is possible optionally to specify one or more positions for possible perspectives for the image data to be calculated.

Afterward, a visual representation of the component is calculated in act S3. In this case, the component is calculated using the provided design data and the provided specifications for the surface properties. Furthermore, it is possible to carry out the calculation of the visual representation for the specified perspectives. In this case, the specified perspectives may be one or more predefined points in space or else optionally a movement trajectory of a virtual camera.

Once the visual representation of the component has been calculated on the basis of the boundary conditions described, act S4 involves automatically allocating predetermined identifiers to the calculated visual representation of the component. In this case, automatically allocating the identifier is carried out on the basis of the parameters that were taken as a basis for the calculation of the visual representation in act S3. Moreover, the explanations that have already been described above in association with the apparatus are also applicable to the method for generating the identified image data.

To summarize, the present disclosure relates to automatic generation of identified image data. The identified image data may be utilized in modern industrial installations for the purpose of monitoring and diagnosing components, installation components through to entire industrial installations. The identified image data here serve as a reference or a training basis for the evaluation of image data of real installation components.

The present disclosure relates, in particular, to automatic generation of identified image data. For this purpose, on the basis of design data already present for a component, a visual representation of the component is calculated, wherein the surface properties of the visual representation of the component may be varied on the basis of predefined characteristic properties. Because, during the calculation of such visual representations, both the component itself and the underlying characteristic surface properties are known, it is possible to utilize this information for identifying the corresponding parts in the visual representation in order to enable an automatic identification of the calculated visual representation. In this way, image data may be automatically generated and simultaneously identified, without this necessitating manual intervention. This makes it possible to create identified image data on a large scale with a high quality.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for generating identified image data of components, the method comprising:
   providing design data for a component;
   providing specifications for possible surface properties of the component;
   calculating a visual representation of the component using the provided design data and the provided specifications for the surface properties of the component; and
   automatically allocating predetermined identifiers to the calculated visual representation of the component, the automatic allocation comprising:
   (a) a multilevel hierarchical characterization of at least one part of the component, or
   (b) a diagnosis for a predefined fault, possible damage, a prognosis for a probability of failure, a repair recommendation, or a combination thereof.

2. The method of claim 1, wherein the provided specifications comprise characteristic textures for predetermined regions of a surface of the component.

3. The method of claim 2, wherein the characteristic textures comprise properties selected from the group consisting of wear, aging, loading, contamination, potential probability of failure of the component, and combinations thereof.

4. A computer-implemented method for generating identified image data of components, the method comprising:
   providing design data for a component;
   providing specifications for possible surface properties of the component;
   calculating a visual representation of the component using the provided design data and the provided specifications for the surface properties of the component; and
   automatically allocating predetermined identifiers to the calculated visual representation of the component,
   wherein the calculating comprises calculation of the visual representation along a predefined movement path.

5. The method of claim 1, wherein the design data comprise computer aided design (CAD) data or manufacturing data for producing the component.

6. The method of claim 1, wherein the automatically allocating comprises the multilevel hierarchical characterization of the at least one part of the component.

7. The method of claim 1, wherein the automatically allocating comprises the diagnosis for the predefined fault, the possible damage, the prognosis for the probability of failure, the repair recommendation, or the combination thereof.

8. The method of claim 1, further comprising:
   storing the visual representation of the component together with the allocated identifier in a database; and
   comparing a camera image of a component to be diagnosed with the stored visual representation.

9. An apparatus for automatically generating identified image data of components, the apparatus comprising:
   a first database configured to provide design data for a component;
   a second database configured to provide specifications for possible surface properties of the component; and
   an image data generator configured to calculate a visual representation of the component along a predefined movement path using the design data provided by the first database and the specifications for possible surface properties provided by the second database, and to assign automatically predetermined identifiers to the calculated visual representation of the component.

10. An analysis apparatus for checking a component, the analysis apparatus comprising:
    a first database configured to provide design data for a component;
    a second database configured to provide specifications for possible surface properties of the component;
    an image data generator configured to calculate a visual representation of the component using the design data provided by the first database and the specifications for possible surface properties provided by the second database, and to assign automatically predetermined identifiers to the calculated visual representation of the component; and
    a reference image data memory configured to store the identified visual representations,
    wherein the analysis appartus is configured to receive a camera image of a component to be checked and to compare the received camera image with the identified visual representations stored in the reference image data memory.

11. The analysis apparatus of claim 10, wherein the analysis apparatus is further configured to identify a correspondence between at least part of the camera image and a part of the visual representations and to output an identifier which has been assigned to the identified correspondence in the visual representation.

12. The analysis apparatus of claim 10, further comprising:
    a control device configured to generate control commands depending on a result of the comparison with the identified visual representations and to output the generated control commands.

13. The analysis apparatus of claim 10, wherein the analysis apparatus is further configured to carry out the comparison between the camera image and the stored identified visual representations based on artificial intelligence.

14. The analysis apparatus of claim 10, further comprising:
    an interface configured to receive at least one camera image of the component to be checked.

15. The analysis apparatus of claim 13, wherein the artificial intelligence is a convolutional neural network.

16. The method of claim 4, wherein the provided specifications comprise characteristic textures for predetermined regions of a surface of the component.

17. The method of claim 16, wherein the characteristic textures comprise properties selected from the group consisting of wear, aging, loading, contamination, potential probability of failure of the component, and combinations thereof.

18. The method of claim 4, wherein the design data comprise computer aided design (CAD) data or manufacturing data for producing the component.

19. The method of claim 4, wherein the automatically allocating comprises a multilevel hierarchical characterization of at least one part of the component, or
    wherein the automatically allocating comprises diagnosis for a predefined fault, possible damage, a prognosis for a probability of failure, a repair recommendation, or a combination thereof.

20. The method of claim 4, further comprising:
    storing the visual representation of the component together with the allocated identifier in a database; and
    comparing a camera image of a component to be diagnosed with the stored visual representation.

* * * * *